(12) United States Patent
Bril

(10) Patent No.: US 6,177,959 B1
(45) Date of Patent: Jan. 23, 2001

(54) CIRCUIT AND METHOD FOR GENERATING A CLOCK SIGNAL SYNCHRONIZED WITH TIME REFERENCE SIGNALS ASSOCIATED WITH TELEVISION SIGNALS

(75) Inventor: Vlad Bril, Campbell, CA (US)

(73) Assignee: TeleCruz Technology, Inc., San Jose, CA (US)

( * ) Notice: Under 35 U.S.C. 154(b), the term of this patent shall be extended for 0 days.

(21) Appl. No.: 09/001,413

(22) Filed: Dec. 31, 1997

(51) Int. Cl.[7] .................................................. H04N 5/04
(52) U.S. Cl. ..................... 348/521; 348/536; 348/537; 348/540; 348/541; 348/543; 348/544; 348/546; 331/2; 331/20; 375/327; 375/373; 375/375; 375/376
(58) Field of Search ..................... 348/536, 537, 348/540, 541, 543, 544, 546; 331/20, 2; 375/373, 375, 376, 327; H04N 5/04

(56) References Cited

U.S. PATENT DOCUMENTS

| | | | |
|---|---|---|---|
| 5,043,813 | * 8/1991 | Christopher | 358/148 |
| 5,541,556 | * 7/1996 | Francis | 331/4 |
| 5,719,511 | * 2/1998 | Le Cornec et al. | 327/146 |
| 5,760,839 | * 6/1998 | Sumiyoshi | 348/541 |
| 5,790,200 | * 8/1998 | Tsujimoto et al. | 348/545 |
| 5,856,851 | * 1/1999 | Makita | 348/537 |
| 5,912,713 | * 6/1999 | Tsunoda et al. | 348/540 |
| 5,929,923 | * 7/1999 | Yamauchi et al. | 348/538 |
| 6,005,634 | * 12/1999 | Lam et al. | 348/541 |
| 6,014,177 | * 1/2000 | Nozawa | 348/540 |
| 6,028,641 | * 2/2000 | Kim | 348/537 |

* cited by examiner

Primary Examiner—Michael Lee
Assistant Examiner—Brian P. Yenke
(74) Attorney, Agent, or Firm—Law Firm of Naren Thappeta (57) ABSTRACT

A clock generation circuit for use in a television system displaying images encoded in television signals and images represented by network application data. The clock generation circuit generates a clock signal synchronized with HSYNC signals of the television signals. The clock generation circuit includes a phase-lock-loop (PLL) circuit and a tracking block. PLL circuit includes an oscillator (e.g., VCO) driven by an error signal to generate an internal periodic signal having frequency substantially equal to the frequency of the desired clock signal. The tracking block includes a resettable VCO (RVCO) driven by the error signal. A restart signal is asserted prior to the expected arrival time of the HSYNC edge to cause the RVCO to stop generating the desired clock signal. The restart signal is deasserted on receiving the HSYNC edge to cause the RVCO to start generating the clock signal. Accordingly, the clock signal is synchronized with the HSYNC signal.

14 Claims, 6 Drawing Sheets

CIRCUIT AND METHOD FOR GENERATING A CLOCK SIGNAL SYNCHRONIZED WITH TIME REFERENCE SIGNALS ASSOCIATED WITH TELEVISION SIGNALS

RELATED PATENTS

The present application is related to the following Patent Applications, which are all incorporated by reference in their entirety herewith:

1. United States Patent Application entitled, "A Method and Apparatus for Enabling a User to Access Data Network Applications from a Television System", Filed Jun. 2, 1997, U.S. Ser. No. 08/867,203, which issued as U.S. Pat. No. 5,946,051 on Aug. 31, 1999 (hereafter "Related Patent 1"); and 2. United States Patent Application Entitled, "A Method and Apparatus for Reducing Flicker in the Television Display of Network Application Data Displayed with Images Encoded in a Television Signal", filed on even date herewith, which issued as U.S. Pat. No. 5,959,680 on Sep. 28, 1999 (hereafter "Related Patent 2").

BACKGROUND OF THE INVENTION

1. Field of the Invention

The present invention relates generally to television systems, and more specifically to a method and apparatus for generating a clock signal synchronized with time reference signals (e.g, HSYNC) associated with a television signal.

2. Related Art

Figure 1:
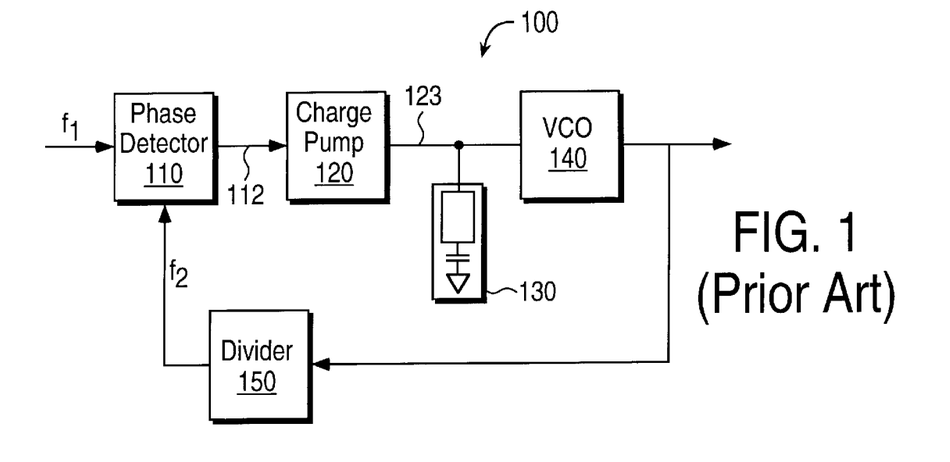
FIG. 1 is a block diagram of a phase lock loop circuit illustrating the problems associated with some prior systems.

Phase-lock-loop circuits (PLLs) are often used to generate a clock signal synchronized with an external time reference signal. FIG. 1 is a block diagram of illustrating an example implementation of a PLL circuit. PLL circuit 100 includes phase detector 110, charge pump 120, filter 130, voltage controlled oscillator (VCO) 140, and frequency divider 150. Phase detector 110 compares an external time reference signal received on line 101 and a signal having a fraction (determined by frequency divider 150) of the frequency of the generated clock signal received on line 151. The two signals are referred to as f1 and f2 for brevity.

Phase detector 110 provides on line 112 a voltage signal indicative of the difference of the phases of f1 and f2. The signal on line 112 charges charge pump 120. When frequencies f1 and f2 are synchronized perfectly, the signal on line 112 may be at zero voltage and charge pump 120 may not be charged. Filter 130 is generally designed as a low pass filter to eliminate undesirable high frequency components. When the frequencies f1 and f2 are close, but not equal, line 123 will carry a voltage signal proportional to the difference in frequencies.

VCO 140 is designed to generate a clock signal with a predetermined frequency (equal to the desired clock frequency). The predetermined frequency equals f2×N, where N is the divisor in the frequency divider 150. When f2 is not an integral multiple of f1, a multiplier can be used to multiply frequency f1 and the value of n is chosen to achieve the desired frequency f2. The frequency of VCO 140 is altered depending on the voltage level received on line 123. The voltage level on line 123 is generated so as to achieve a synchronization of the frequencies f1 and f2. The voltage level on line 123 may be amplified if needed to achieve such a synchronization.

Frequency divider 150 divides the frequency of clock signal received on line 145 by a factor of N. In a steady synchronized state, f1=f2 and the clock frequency generated by VCO 140 equals N×f1. Thus, by a proper choice of N, a clock signal of a desired frequency can be generated.

PLL circuits such as the one described in FIG. 1 are generally acceptable when the value of N is small (e.g., about 10). However, as the value of N becomes large, synchronizing the clock signal with the external time reference signal can become problematic as the correction of any misalignments between f1 and the generated clock signal occurs only once every cycle of the reference clock f1.

The large correction times can be problematic in several environments such as display units which operate at high speeds. The absence of synchronization can result in display artifacts as is also well known in the art. For example, a television system may be used for displaying images encoded in television signals as well as images representative of services/data accessed on a network. One or more embodiments of such television systems are described in Related Patent 1 noted above.

In such systems, the display of network application data may need to be synchronized with the time reference signals associated with a television signal. To process and display network application data, clock signals having a frequency of as high as 40 MHZ may be required. The time reference signals of television signals can have a frequency of as low as 30 KHz. Thus, magnifications of the order of few hundreds to a thousand (N=100 to 1000) may be required. In such situations, PLL circuits such as the one described with reference to FIG. 1 may not be acceptable.

Therefore, what is needed is a PLL circuit for generating a clock signal, which is synchronized well even in situations when the clock signal has a frequency substantially greater than the frequency of the external time reference signal. In addition, the PLL should operate in situations such as the television systems (e.g, those described in Related Patent 1) which provide combined display of television signal images and network application data image.

SUMMARY OF THE INVENTION

The present invention is directed to a clock generation circuit which generates a clock signal synchronized with an edge of an external time reference signal. The clock generation circuit is described in the context of a television system, which displays images encoded in television signals along with the images representing network application data. The clock signal is synchronized with the HSYNC signal of the television signal such that the points on the network application data images are accurately correlated with the points on the television signal images.

In one embodiment of the present invention, the clock generation circuit includes a phase-lock-loop (PLL) circuit and a tracking block. The PLL circuit includes a voltage controlled oscillator (VCO) driven by an error voltage generated by phase detector. The output of the VCO is a periodic signal having a frequency substantially equal to the frequency of the desired clock signal. The PLL circuit uses a high-quality high frequency oscillator to ensure that the periodic signal is closely synchronized with the internal reference signal. That is, close synchronization is maintained by designing the PLL circuit such that the periodic signal has a frequency which is a low multiple of the frequency of the internal reference signal.

The tracking block includes a resettable VCO (RVCO), which can be reset and restarted by asserting and deasserting a restart input. The RVCO is driven by the same error voltage of the PLL circuit, and is designed to generate the desired clock signal. A restart circuit asserts the restart input a short time before the expected arrival time of the edge of the external reference signal to stop the RVCO from generating the clock signal. The restart input is deasserted on the arrival of the edge of the external reference signal to restart the RVCO. Thus, the generated clock signal is synchronized with the external reference signal.

After being restarted, RVCO reaches a steady state in a short duration as the error voltage is computed in the PLL circuit. To prevent any glitches from being transmitted as the clock signal, a stop circuit is employed according to one aspect of the present invention. The stop circuit generates a stop signal a few clock cycles after the receipt of the edge of the time reference signal. The stop signal is provided as an input to an AND gate, which gates the output of RVCO as the clock signal only when the stop signal is not generated. The stop signal may be asserted a short duration prior to the arrival of the edge also. The stop signal operates to ensure that glitches are avoided in the generated clock signal. In addition, the stop signal can be asserted to ensure that only a desired number of clock cycles are generated during each period of the external reference signal.

Thus, the present invention provides a clock signal which is synchronized with an external reference signal. Synchronization may be achieved by stopping a RVCO from generating the clock signal, and restarting the clock signal generation synchronous with the reference signal.

The RVCO may not take substantial time to reach a steady state during the restarting process as the RVCO is driven by an error voltage generated in an external circuit (PLL).

Potential glitches in the clock signal are avoided by employing a gating circuit which does not provide the output of the RVCO as the clock signal a few cycles before receiving the edge of the time reference signal and a few cycles after restarting the RVCO.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

The present invention will be described with reference to FIG. 2, which is a block diagram of clock generation circuit 200 illustrating an example implementation of the present invention. Clock generation circuit 200 includes PLL circuit 249 and synchronization circuit (or tracking block) 299. Broadly, PLL circuit 249 generates an output signal with low jitter. In one embodiment, the output signal has a frequency equal to the frequency of the desired clock signal.

Tracking block 299 generates a clock signal having a frequency approximately equal to the frequency of the output signal of PLL circuit 249. The manner in which such closeness is achieved in an example implementation will be described below. Tracking block 299 generates the desired clock signal, which is synchronized with an edge of an external time reference signal. Synchronization is achieved by disabling (stopping) the desired clock signal for one or more ("few") clock cycles prior to the arrival of the edge, and starting the clock signal synchronous with the edge of the external time reference signal. In addition, glitches are avoided in the provided clock signal by disabling the clock signal for a few clock cycles.

Thus, a clock signal synchronized with an external signal can be generated in accordance with the present invention. One or more embodiments implementing the present invention are described below. Example implementations for circuits 249 and 299 are also described below. However, it should be apparent to one skilled in the relevant arts how to implement several other embodiments without departing from the scope and spirit of the present invention by reading the description herein.

2. Example Implementation of the Present Invention

Figure 2:
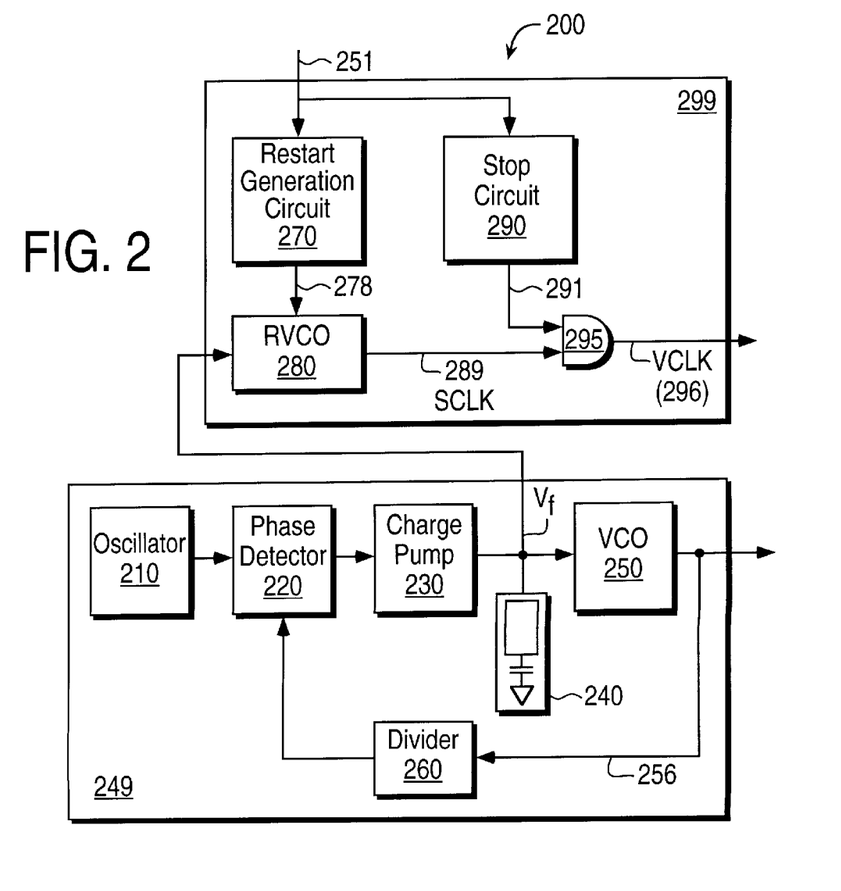
FIG. 2 is a block diagram of a clock generation circuit in one embodiment of the present invention.

FIG. 2 further illustrates an example logical implementations for PLL circuit 249 and tracking block 299. It should be understood that various modifications can be made to the embodiments described there without departing from the scope and spirit of the present invention. For example, even though PLL circuit 249 and tracking block 299 are described with analog components such as VCOs, the circuits can be implemented using digital components such as discrete time oscillators (DTOs).

PLL circuit 249 operates from a high frequency reference signal (internal reference signal) generated by oscillator 210. The frequency of the output signal of PLL circuit 249 is preferably a low multiple (e.g., less than 20) of the internal reference clock frequency. Due to such a low multiple, the output signal on line 256 is synchronized well with the signal generated by oscillator 210.

In addition, oscillator 210 with low jitter may be chosen, further enhancing the synchronization of output signal on line 256 with the signal generated by oscillator 210. Phase detector 220, charge pump 230, low-pass-filter 240, and divider 260 can be implemented by using various components available in the market place as will be apparent to one skilled in the art by reading the description herein. These components operate to generate a signal (on line 256) which is synchronized well with the internal reference signal on line 212. Divider 260 is implemented to divide the frequency of the signal on line 256 by a low multiple (e.g., less than 20).

Tracking block 299 operates to provide a clock signal of a desired frequency, and is also synchronized with external time reference signal received on line 251. Tracking block 299 of the example implementation includes resettable VCO (RVCO) 280, which has similar signal generating characteristics as VCO 250. RVCO 280 is driven by the same error voltage (Vf) as that which drives VCO 250. Accordingly, the output of RVCO 280 is close in frequency with the output (line 256) of VCO 250.

As will be explained below, the reset and restart input 278 of RVCO 280 is used to synchronize the generated clock signal with the external reference signal 251. When the RESTART signal is at one logical level (e.g., low) RVCO 280 generates an VCLK signal, and when the RESTART signal is at another logical level (e.g., high), RVCO 280 stops generating the VCLK signal. When RVCO 280 resumes generating VCLK signal, minimal time may be taken for RVCO 280 to start generating VCLK signal with the desired frequency because RVCO 280 is driven by the same error signal Vf as VCO 250.

Restart generation circuit 270, stop circuit 290 and AND gate 295 operate to synchronize the clock signal with the external reference signal 251. In particular, restart generation circuit 270 receives the external reference signal 251, and generates a RESTART signal. Restart generation circuit 270 drives RESTART signal 278 to a high logical level a few clock cycles before an edge of the external reference signal 251, and to a low logical level immediately after receiving the edge of the external reference signal 251.

In response to the RESTART signal input 278 going low, RVCO 280 begins generating the SCLK signal 289. As the SCLK signal is started synchronous with an edge of the external reference signal 251, the SCLK signal on line 289 is synchronized with the external reference signal 251. In addition, as RVCO 280 is stopped prior to synchronization, glitches may be avoided in the SCLK signal 289.

Stop circuit 290 and AND gate 295 operate to ensure that the number of clock cycles during which no clock cycles are generated on VCLK line 296 is predictable. That is, stop circuit 290 drives VCLK-DISABLE signal 291 to low logical level for a short duration. During this time duration, synchronization of the clock signal 296 is achieved. While such synchronization is achieved, no clock signal is provided on VCLK line 296.

Stop circuit 290 drives VCLK-DISABLE signal 291 to a low logical value after a predetermined number of clock cycles to ensure that a fixed number of clock cycles are provided in each period of the external reference signal 251. In addition, the VCLK-DISABLE signal 291 may be maintained at a low logical level value for a few clock cycles after RVCO 280 is restarted so that RVCO 280 is at a steady-state when SCLK signal 289 is provided as VCLK signal 296. Maintaining VCLK-DISABLE signal 291 at a low logical level for a few clock cycles may help further eliminate any glitches in VCLK signal 296. Glitches generally refer to the a clock signal asserted or deasserted for less than a complete desired clock phase.

Thus, tracking block 299 of FIG. 2 generates a clock signal synchronized with reference signal 251 by starting the RVCO 280 immediately after receiving an edge of the reference signal 251. In addition, glitches are avoided in VCLK signal 296 by stopping the RVCO 280 for a short time before synchronization, and by not providing SCLK signal as VCLK signal for a few clock cycles. An example implementation of tracking block 299 is explained in further detail with reference to FIG. 3.

3. Example Implementation of Tracking block 299

Figure 3:
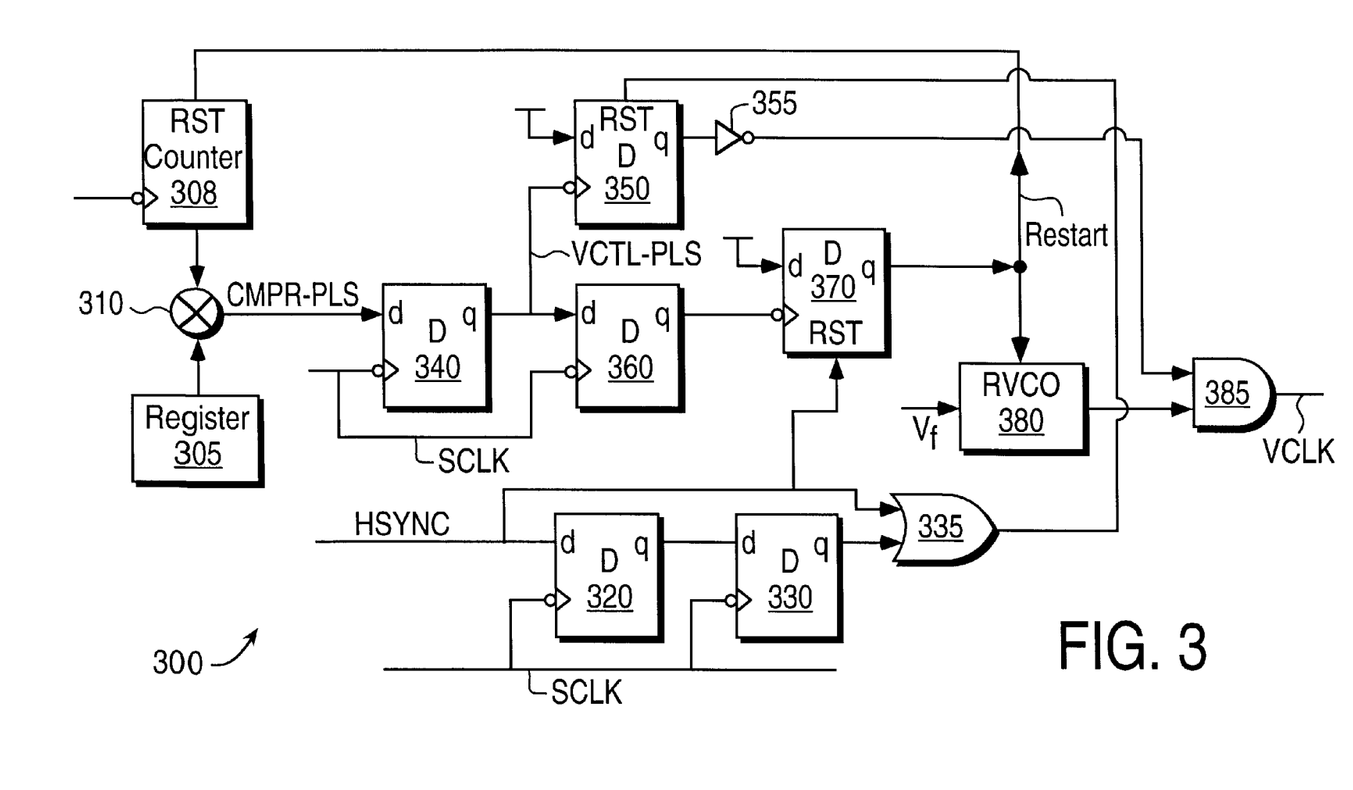
FIG. 3 is a block diagram of a tracking block in one embodiment of the present invention.
Figure 4:
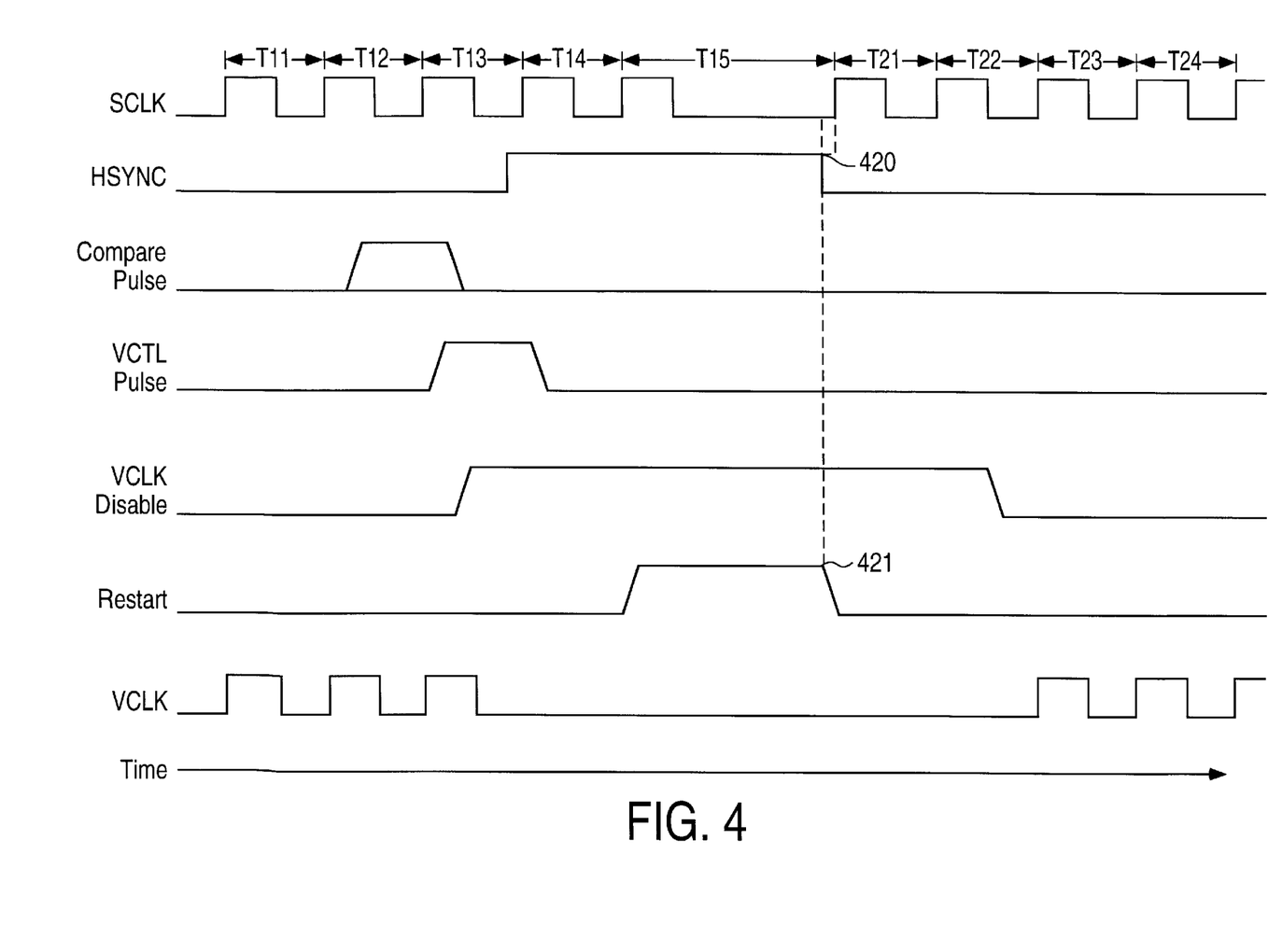
FIG. 4 is a timing diagram illustrating the timing relationship between various signals in one embodiment of the present invention.

FIG. 3 is a block diagram of tracking block 299 illustrating an example implementation in accordance with the present invention. The operation of tracking block 299 will be explained with combined reference to FIGS. 3 and 4, wherein FIG. 4 is a timing diagram illustrating the timing relationship of various signals used by tracking block 299. All the signals are described with reference to time scale shown as VCLK clock cycles.

HSYNC is an example time reference signal with which clock signal VCLK is synchronized. In the description herein, HSYNC will be assumed to represent horizontal synchronization signals typically received with television signals. The VCLK clock cycles during first HSYNC period are shown as T1X and the clock cycles during second HSYNC period is shown as T2X. HSYNC signal is shown going to a high level at the end of clock period T13. As will be clear from the following description, VCLK clock signal is synchronized with the falling edge of HSYNC signal.

Register 305 (of FIG. 3) stores the desired number of VCLK clock cycles during each reference signal period. Register 305 is programmable by a user. In the example described herein, the value is set to four less than the number of VCLK periods at which the next reference signal pulse is expected to occur. Due to various factors (e.g., jitter) the actual arrival time of the VCLK reference pulse can vary by a few cycles. The value stored in register 305 should be less than the earliest duration in which the reference signal pulse can occur. However, if the value is too small, the effective idle time (i.e., time during which no clock signal is generated) may be undesirably long, and the effective average clock frequency over an extended period will be low.

Counter 308 counts the number of VCLK clock periods and is reset by RESTART signal. That is, counter 308 counts the number of VCLK clock periods after being reset by RESTART signal. Comparator 310 compares count value in counter 308 with the preset value in register 305, and generates COMPARE-PULSE (i.e., set to one) signal when the two values are equal. Assuming, equality was detected during clock cycle T12 of FIG. 4, COMPARE-PULSE is shown going to a high logical level during VCLK cycle T12.

It should be understood that COMPARE-PULSE can occur any time before the falling edge of HSYNC assuming the VCLK signal is synchronized with the trailing edge of HSYNC. In one embodiment, COMPARE-PULSE is designed to occur 5 nano-seconds prior to the expected occurrence of the next synchronization point (i.e., point 420 of FIG. 4). The 5 nano-seconds period corresponds to the desired upper limit for the jitter in the generated clock signal. It should be further understood that the VCLK signal can be optionally synchronized with the rising edge of HSYNC also if a designer so chooses.

Delay flip-flops 340 and 360 are clocked by the SCLK signal. Flip-flop 340 generates VCTL-PULSE during the next SCLK clock cycle (i.e., T13). Flip-flop 360 generates the VCTL-PULSE delayed by another VCLK clock cycle (T14). As delay flip-flop 370 is clocked by the output of flip-flop 360, flip-flop 370 drives RESTART signal to a logical high value two VCLK clock cycles after the COMPARE-PULSE goes high. Thus, RESTART signal is shown going high during clock cycle T15.

A high logical value of RESTART signal causes resettable VCO (RVCO) 380 (akin to RVCO 280 of FIG. 2) to stop generating the signal SCLK. Accordingly, SCLK signal is shown at a low logical level from the middle of clock cycle T15. RVCO 380 stays in the sane state until the RESTART signal goes to a low logical level.

Flip-flop 370 is reset by the falling edge of HSYNC signal shown at point 420 of FIG. 4, and accordingly the RESTART signal goes to a low logical value at a corresponding point 421. Soon after RESTART goes low, RVCO 380 starts generating SCLK clock signal. The clock cycles are represented as T21, T22, T23 etc. RESTART signal also resets counter 308 to begin counting the SCLK cycles.

VCLK disable signal is controlled by the operation of delay flip-flops 320, 330, and 350, OR gate 335, and inverter 355. The clock enable input of flip-flop 350 is connected to VCTL-pulse. Thus, on the VCLK-pulse signal going to a high logical level (VCLK cycle T13), VCLK-disable signal is driven to a high logical value. Inverter 355 inverts the VCLK-disable signal. The inverted signal is coupled to an input of AND gate 385. As a result, the SCLK signal is not gated out as VCLK signal until flip-flop 350 is reset to a low logical level.

The output of OR gate 335 provides such a reset signal to flip-flop 350. The output of OR gate 335 remains at a logical high level during the HSYNC high time period and also for two SCLK cycles after HSYNC signal is driven to a low logical level due to the two delay flip-flops 320 and 330. The additional two clock cycles may provide sufficient time for any transients to disappear as SCLK signal is restarted.

Thus, two clock cycles after HSYNC signal goes to a low logical level, flip-flop 350 is reset and the VCLK-disable signal goes low. AND gate 385 provides SCLK signal as VCLK signal thereafter. Accordingly, SCLK is shown being generated from clock cycle T21, whereas VCLK clock is shown generated from clock cycles T23 in FIG. 4.

From the above description, it should be understood that a clock signal synchronized with an external time reference signal can be generated in accordance with the present invention. The present invention summarized with reference to the flow-chart of FIG. 5.

4. Method of the Present Invention

Figure 5:
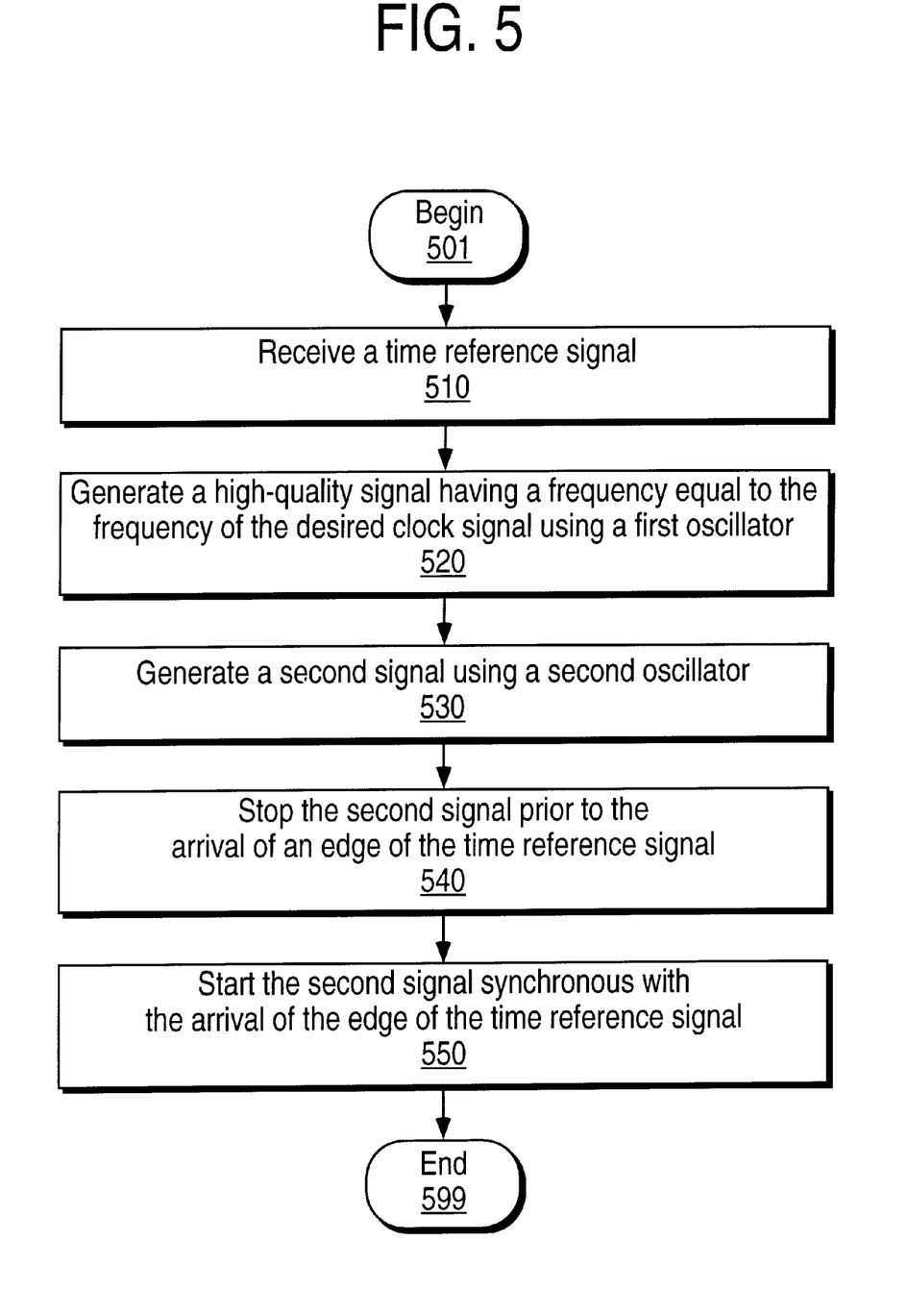
FIG. 5 is a flow-chart illustrating the steps performed in accordance with the present invention.

FIG. 5 is a flow-chart illustrating the method of the present invention. In step 510, the external time reference signal is received. In step 520, a high quality signal having a frequency equal to the desired frequency is generated using a first oscillator. The first oscillator is driven by an error signal to generate the high quality signal. In step 530, a second signal is generated using a second oscillator. The second oscillator is driven by the same error signal as that which drives the first oscillator. Driving by the same error signal enables the second oscillator to reach a steady state quickly even after it is restarted in steps 540 and 550.

In step 540, the second oscillator is disabled to stop the generation of the clock signal for a short duration prior to the arrival of an edge of the external reference signal, with which the clock signal to be generated is synchronized. Upon arrival of the edge, the clock signal is enabled again synchronous with the received edge in step 550. Thus, the clock signal is synchronized with the external time reference signal in accordance with the present invention.

The present invention can be used in several environments. The application of the present invention in an example environment will be described now.

5. Example Environment in Which the Present Invention Can be Implemented

In a broad sense, the present invention can be implemented in any environment to generate a clock signal synchronized with an external time reference signal. The environment should preferably operate properly when the generated clock signal stays idle (e.g., when the pulses are absent on VCLK signal in FIG. 4).

Figure 6:
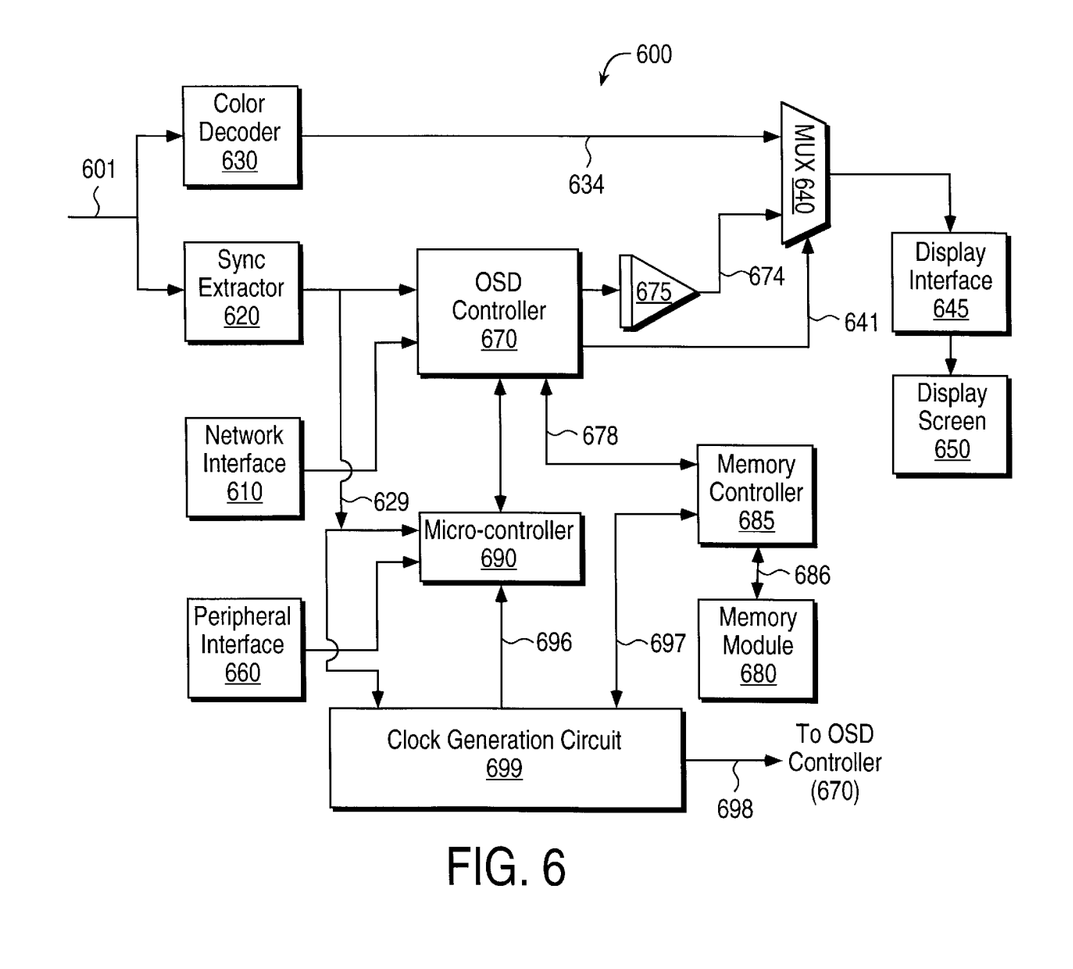
FIG. 6 is a block diagram of a television system illustrating an example environment in which the present invention can be used.

FIG. 6 is a block diagram of a television system 600 illustrating an example environment in which the present invention can be implemented. The components of television system 600 are described only to the extent necessary for understanding the present invention. For a more detailed description of television system 600, the reader is referred to Related Patent 1 and Related Patent 2, referred to in the section entitled, "Related Patents", which are incorporated herein by reference in their entirety.

Television system 600 in accordance with the present invention includes clock generation circuit 699. As will be explained, clock generation circuit 699 of the present invention receives time reference signals (HSYNC) of a composite television signal, and generates a clock signal synchronized with the HSYNC signal. Such a synchronization may be important as images encoded in the television signal may be displayed along with images represented by network application data on a single display screen. The synchronization enables individual points on television signal images to be correlated to points on images represented by network application data images. Some or all of the functions of clock generation circuit 699 may be implemented in other components of television system 600. For example, some of the functions of clock generation circuit 699 are described as being implemented in OSD controller in Related Patent 1 and Related Patent 2.

Television system 600 further includes sync extractor 620, color decoder 630, multiplexor 640, display interface 645, display screen 650, peripheral interface 660, on-screen-display (OSD) controller 670, digital-to-analog converter (DAC) 675, memory controller 685, memory module 680, and micro-controller 690. Micro-controller 690 generates control signals to coordinate and control the operation of the remaining components of television system 600. For purpose of clarity, only some of the connections from micro-controller 690 are shown in FIG. 6. Each of the components of television system 600 are explained in further detail below.

Network interface 610 receives network application data from an external source. Network interface 610 can be a telephone modem, cable modem or any other interface which is designed to operate with the external source. The external source can be, for example, a dial-up connection (point-to-point) or a network connection implemented using a communication protocol. Even though network interface 610 is shown as a single block, it should be understood that it may contain more than one unit depending on the specific requirements of the individual television system.

Network interface 610 receives data corresponding to network applications (including services) such as web-browsing, electronic mail in a known way. The data may be received in one of known formats such as ASCII, HTML, VRML etc. which are encoded as electrical signals. Network interface 610 sends signals representative of the network application data to OSD Controller 670.

OSD Controller 670 receives network application data from network interface 610, and stores the received data in memory module 680 by interfacing with memory controller 685. Memory module 680 may include one or more physical memory units as suitable for the specific requirements for which television 600 is designed for. Memory controller 685 interfaces with OSD controller 670, and enables OSD controller 670 to store and retrieve data from memory module 680. The implementation of memory controller 685 depends on the specific technology chosen for memory module 680, and can be provided integral to a memory storage unit.

Figure 7A:
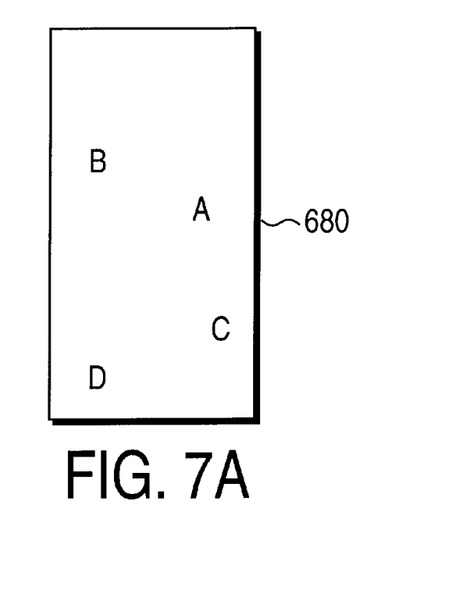
FIG. 7 is a diagram illustrating the manner in which one embodiment of the present invention generates a combined display of network application data and images encoded in television signals.
Figure 7B:
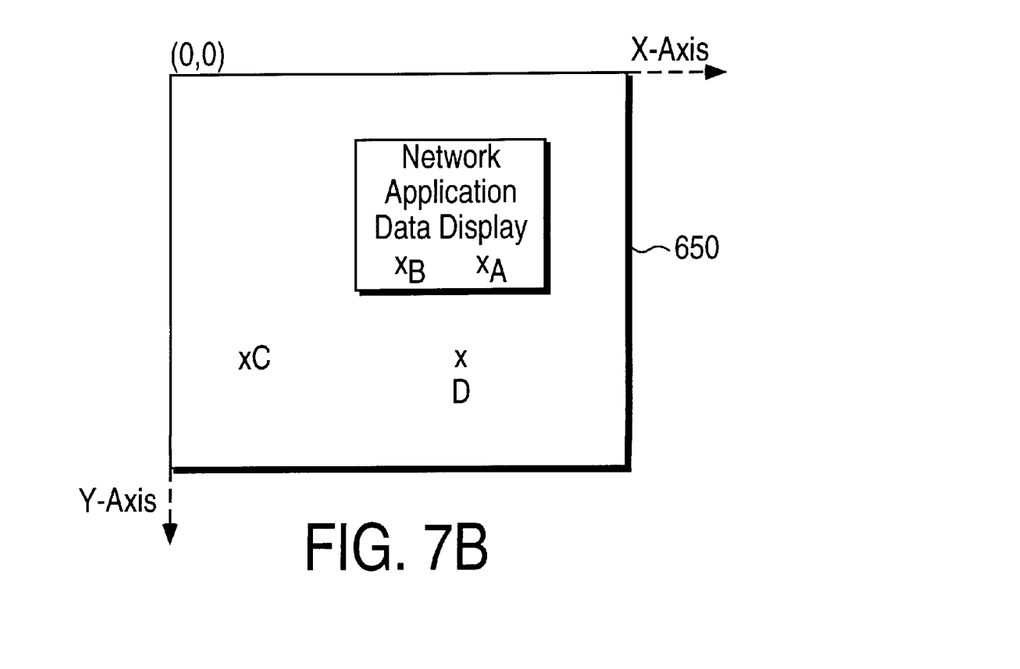

OSD Controller 670 transforms the network application data as is suitable for storage and retrieval from memory module 680. The storage scheme may include conventions to represent the area on which network application data is to be displayed. In one example embodiment, OSD controller 680 stores the network application data as a "bit map" encoded in RGB format in memory module 180 as shown in FIGS. 7A and 7B, which are explained in further detail below.

OSD controller 670 may be designed to store other display entities as well. These display entities may provide additional capabilities or enhance the ease of use of television system 600. However these other display entities will not be described here as they are not relevant to an understanding of the present invention. For the purpose of explaining the present invention, it will be assumed that OSD controller 670 stores only network application data in memory module 680. For details of other display entities which may stored in memory module and the manner in which they are stored, the reader is referred to Related Patent 1, which is incorporated in its entirety herewith.

Also, OSD controller 670 receives pixel elements of network application data image in a non-interlaced format from memory controller 685, but provides pixel elements corresponding to an image of an interlaced format. This conversion simplifies the overlay process between the television signal display and network application data display. In addition, OSD controller 670 filters the pixel data elements received to smooth out the network application data image. The pixel data elements representing the smoothed image (i.e., without sharp transitions) is provided in the interlaced format. OSD controller 670 performs all such functions under the control of clock signals generated on line 698.

Digital-to-analog converter (DAC) 675 receives the pixel data elements representing the smoothed image from OSD controller 670 and generates analog display signals on line 674 from the pixel data elements. Each pixel data element typically represents the color of a point on display screen 650 when line 641 indicates that network application data is to be displayed. Such a decision may be made on a point-by-point basis by OSD controller 670.

Sync extractor 620 and color decoder 630 receive a television signal on line 601 from sources such as cable service providers, television (relay) stations, digital video disk players, etc. The TV signal is generally received in a known format, for example, in NTSC composite video format. However, television signal can be any other signal including an interlaced display signal and corresponding time reference signals. Decoder 630 extracts the interlaced display signal which is encoded in the television signal and provides the display signal to multiplexer 640 on display signal line 634.

Sync extractor 620 extracts (or generates) time reference signals present in the television signal in a known way. The time reference signals are provided to micro-controller 690, OSD controller 670, and clock generation circuit 699 to coordinate the network application data flow consistent with the reception of the television signal.

Specifically, clock generation circuit 699 (including clock generation circuit 200 of FIG. 2) receives HSYNC signal on line 629 (line 251 of FIG. 2), and generates a clock signal (VCLK signal of FIG. 2) on line 698 in accordance with the present invention. As described above, the clock signal is stopped for a short duration to achieve synchronization. In addition, clock generation circuit 699 needs to be programmed to specify the desired number of clock cycles in each HSYNC period.

OSD controller 670 needs to be designed to generate pixel data to DAC 675 using these desired number of clock cycles. OSD controller 670 needs to generate pixel data elements such that television signal portion and pixel data element received at multiplexor 640 correspond to the same point on display screen 650. As clock signal 698 is genlocked to HSYNC signal, OSD controller 670 may be able to achieve such a correlation. In addition, OSD controller needs to operate without clock cycles during the period no clock signal is generated on line 698.

Clock generation circuit 699 may generate clock signals for other components as well. These clock signals may be generated to be independent of clock signal 698. That is, these clock signals can have different frequencies and may not be stopped (or disabled) for a short duration. Thus, clock signal 696 drives the operation of micro-controller 690, and clock signal 697 drives the operation of memory controller 685.

Multiplexor 640 receives the interlaced television signal and the analog display signals as inputs on lines 634 and 674 respectively, and selectively forwards one of the two inputs to display panel interface 645 under the control of select line 641. The select line is controlled by OSD controller 670 in one embodiment. As the two signals received on lines 634 and 674 correspond to the same point on display screen 650, the selection is performed on a point-by-point basis. The selection results in an overlay. Thus, the television signal display and network application data display are overlayed before a unified display is provided on display screen 650. From the description herein, it will be apparent that multiplexor 640 along with OSD controller 670 form a selection circuit to overlay the display entities displayed by television 600. In one embodiment, select line 641 is controlled by OSD controller 670 and each multiplexor input corresponds to a single pixel on display screen 650.

Multiplexor 640 along with select line 641 operates to select between the television signal and the pixel data received on line 634. Even though the processing of television signal and network application data is explained with reference to RGB data, it should be understood that the present invention can be implemented using other data formats also without departing from the scope and spirit of the present invention.

In the description above, multiplexor 640 and DAC 675 operate as a selection circuit. The selection circuit operates in an analog domain in the sense that the inputs to multiplexor 640 are in the form of analog signals. However, it should be understood that the selection can be performed in a digital domain as well without departing from the scope and spirit from the present invention. Such a digital operation is described in Related Patent 1, which is incorporated in its entirety herewith.

Display interface 645 receives display signals from multiplexor 640, and provides any signaling interfacing required for display on display screen 650. If display screen 650 is implemented as a CRT screen, display interface 645 generates electrical signals to control the scan circuitry usually associated with CRT screens. The design and implementation of display interface 645 depends on the specific technology chosen for display screen 650. The implementation of display interface 645 will be apparent to one skilled in the art. It is contemplated that the present invention can be implemented with technologies such as digital television systems (e.g., HDTV) and flat-panel based TVs, projection TVs based on DMD (digital mirror display) etc.

Micro-controller 690 receives these time reference signals on line 629 and clock signals on line 696, and configures the remaining components based on the received signals. For example, micro-controller 690 causes the creation of bit-maps corresponding to the received network application data. In addition, micro-controller 690 ensures that the pixel data elements received on lines 634 (for television signal) and 678 (the overlayed image of display entities stored in memory module 680) correspond to the same point/pixel on display screen 650.

Peripheral interface 660 can include an interface for one or more peripherals. In one embodiment, interfaces are provided for push-buttons and infra-red remote. Push-buttons can be found on conventional television sets, and are generally used for functions such turning the television set ON/OFF, volume control etc. Infra-red remote interface operates in conjunction with remote control devices, which may be used for several functions such as television control (tuning, voice control, remote control etc.), enabling network applications etc. Devices such as key-boards which facilitate easy entry of ASCII data can be interfaced using infra-red interfaces. The implementation of these interfaces will be apparent to one skilled in the relevant arts based on the disclosure provided herein.

The manner in which network application data is logically stored in memory module 680 in an example implementation is explained below.

6. Storage in Memory Module in an Example Implementation

In an example implementation, network application data is stored in memory module 680 according to the display sought on display screen 650. Typically, a user specifies the portion on display screen 650 on which network application data is to be displayed and the portion on which television signal is to be displayed. Micro-controller 690 generates commands to store data in memory module to correspond to the user specification. Data is stored in memory module 680 according to these commands. OSD controller 670 is designed to receive this data and generate a display in the area specified by the user. FIG. 7A illustrates the data format stored corresponding to a desired display illustrated in FIG. 7B.

In FIG. 7B, network application data display 760 is shown on a portion of display screen 650. Network application data display 760 can occupy all the surface of display screen 650 if so specified by a user. If network application data display 760 does not occupy the whole surface of display screen 650, television signal display 750 can occupy the area outside of the network application data display 760. The displays shown in FIG. 7B are examples only. The television signal display and network data application can be combined in various ways, for example, as specified by a user. Some of the ways in which the display can be combined is explained in further detail in Related Patent 1 and Related Patent 2, which are incorporated in their entirety herewith.

FIG. 7B includes points A, B, C, D which illustrates in combination with FIG. 7A one convention according to which network application data is represented in memory module 680. The stored data defines the manner in which network application data display is to be combined with television signal display. In FIG. 7A, memory module 680 is shown storing a bit map, with each bit position corresponding to a point on the display screen 650. The bit map can be stored as a surface, with each bit having a coordinate position. Each frame of the television signal also can be viewed as a surface with the same coordinate positions for like relative position in the surface. Thus, left right corner of display screen 650 is shown with X, Y coordinates of (0, 0).

Each bit/point/pixel stored in display memory can generally have a value to represent the display signals to be generated. In one embodiment, each point of the display is represented in pelletized 8 bits per pixel format. That is, the eight bits are latter mapped to a color.

Continuing with the description of FIGS. 7A and 7B, points values A, B, C, and D stored in memory 680 correspond to points A, B, C, D of FIG. 7B. Each value (pixel data element) stored in memory 680 is set to a value representing the color with which a correspond point is to be displayed. However, if a television signal is to be displayed at the corresponding point, the value is set to a special value, termed transparent color. Thus, values corresponding to points C and D (on which the television signal is displayed) of FIG. 7B are set to the transparent color. These values can be set according to the area in which a user desires to have the network application data displayed.

The manner in which an implementation of OSD controller 670 uses the above convention to combine the network application data display with the television signal display is explained above, and in Related Patent 1 and Related Patent 2. Thus, OSD controller 670 combines the display of network application data and television signal images to generate a unified image on display screen 650. OSD controller 670 achieves such a combining function by using clock signals received on line 698.

As described above, clock signals on line 698 are synchronized with HSYNC signals received with television signal. Such synchronization allows the OSD controller 670 to consistently correlate each point of the network application data display with each point of television signal image display. As a result, the television signal images and network application data images can be selected on a point-by-point basis.

In addition, the synchronization may be accurately performed for each HSYNC cycle as the clock signal is stopped briefly prior to the expected arrival time of an edge of the HSYNC signal, and the clock signal is restarted immediately after the arrival of the HSYNC edge.

7. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A clock generation circuit for generating a clock signal synchronized with an edge of a time reference signal, said clock generation circuit comprising:

a first oscillator for generating an internal reference signal;

a phase detector coupled to said first oscillator, said phase detector generating an error voltage proportionate to the difference in phases of said internal reference signal and a divider output signal;

a voltage controlled oscillator coupled to said phase detector, said voltage controlled oscillator generating an internal clock signal having a frequency substantially equal to the frequency of said clock signal, wherein the frequency of said internal clock signal is a low multiple of the frequency of said internal reference clock signal, and wherein the frequency of said internal clock signal is changed according to said error voltage;

a divider coupled to said voltage controlled oscillator and said phase detector, said divider generating said divider output signal, wherein said divider output signal is generated by dividing the frequency of said internal clock signal by said low multiple;

a resettable oscillator driven by said error voltage for generating an SCLK signal, said resettable oscillator having a restart input, wherein said SCLK signal is not generated when said restart input is asserted;

a restart generation circuit for asserting said restart input a short duration prior to the expected arrival of said edge of said time reference signal, said restart generation circuit deasserting said restart input on the arrival of said edge of said time reference signal, whereby said SCLK signal is synchronized with said edge of said time reference signal;

a stop circuit for generating a stop signal a few cycles after said edge of said time reference signal is received;

an AND gate for receiving said SCLK signal and said stop signal, said AND gate providing said SCLK signal as said clock signal when said stop signal is not generated.

2. A clock generation circuit for generating a clock signal synchronized with an edge of a time reference signal, said clock generation circuit comprising:

a phase lock loop for generating an error signal, said phase lock loop comprising:
   a phase detector for receiving an internal reference signal and a divider output signal, said phase detector generating an error signal indicative of the difference of phases of said internal reference signal and said divider output signal;
   a first oscillator coupled to said phase detector, said first oscillator generating an internal signal having frequency substantially equal to the frequency of said clock signal, said first oscillator receiving said error signal and changing the frequency of said internal signal according to said error signal; and
   a divider coupled to said phase detector and said first oscillator, said divider receiving said internal signal and generating said divider output signal by dividing the frequency of said internal signal by a multiple; and a tracking block comprising:
   a resettable oscillator driven by said error signal, said resettable oscillator being designed to generate a SCLK signal having a frequency equal to the frequency of said clock signal, said resettable oscillator having a restart input, wherein said SCLK signal is not generated when said restart input is asserted; and
   a restart generation circuit for asserting said restart input a short duration prior to the expected arrival of said edge of said time reference signal, said restart generation circuit deasserting said restart input on the arrival of said edge of said time reference signal, whereby said SCLK signal is synchronized with said edge of said time reference signal, and wherein said SCLK signal is provided as said clock signal.

3. The clock generation circuit of claim 2, further comprising:

a stop circuit for generating a stop signal a few cycles after said edge of said time reference signal is received; and an AND gate for receiving said SCLK signal and said stop signal, said AND gate providing said SCLK signal as said clock signal when said stop signal is not generated.

4. The clock generation circuit of claim 2, further comprising an external oscillator for generating said internal reference signal, wherein said multiple is a small number such that said internal signal is synchronized closely with said internal reference signal.

5. The clock generation circuit of claim 2, wherein each of said resettable oscillator and said first oscillator comprises a voltage controlled oscillator and said error signal comprises a voltage signal.

6. The clock generation circuit of claim 2, further comprising:

a charge pump coupled to said phase detector, said charge pump being charged by said error signal; and a low-pass filter coupled to said charge pump and said first oscillator, said low-pass filter attenuating the high frequency components from said charge pump to said first oscillator.

7. A television system which provides for a display corresponding to a television signal and also enables a user to access a network application, said television system comprising:

a television signal receiver for receiving said television signal including a time reference signal;

a network interface for receiving data corresponding to said network application;

a memory module for storing data corresponding to said network application;

a display screen for displaying an image corresponding to said television signal and said network application;

a clock generation circuit for generating a clock signal synchronized with an edge of said time reference signal, said clock generation circuit comprising:
   a phase lock loop for generating an error signal, said phase lock loop comprising:
      a phase detector for receiving an internal reference signal and a divider output signal, said phase detector generating an error signal indicative of the difference of phases of said internal reference signal and said divider output signal;
      a first oscillator coupled to said phase detector, said first oscillator generating an internal signal having frequency substantially equal to the frequency of said clock signal, said first oscillator receiving said error signal and changing the frequency of said internal signal according to said error signal; and
      a divider coupled to said phase detector and said first oscillator, said divider receiving said internal signal and generating said divider output signal by dividing the frequency of said internal signal by a multiple; and
   a tracking block comprising:
      a resettable oscillator driven by said error signal, said resettable oscillator being designed to generate a SCLK signal having a frequency equal to the frequency of said clock signal, said resettable oscillator having a restart input, wherein said SCLK signal is not generated when said restart input is asserted; and
      a restart generation circuit for asserting said restart input a short duration prior to the expected arrival of said edge of said time reference signal, said restart generation circuit deasserting said restart input on the arrival of said edge of said time reference signal, whereby said SCLK signal is synchronized with said edge of said time reference signal, and wherein said SCLK signal is provided as said clock signal;

a display controller coupled to said memory module, said display controller processing data stored in said memory module to generate a plurality of pixel data elements representative of images of said network application data, wherein each of said plurality of pixel data elements corresponds to a point on said display screen, said display controller generating said pixel data elements using said clock signal, a multiplexor for receiving each of said plurality of pixel data elements and a portion of said television signal, wherein the received portion of said television signal and a corresponding pixel data element correspond to the same point on said display screen, wherein the synchronization of said clock signal with said time reference signals enables said display controller to provide said plurality of pixel data elements to said multiplexor such that said multiplexor receives portion of said television signal and a pixel data element corresponding to the same point on said display screen at the same time.

8. The television system of claim 7, wherein said clock generation circuit further comprises:

a stop circuit for generating a stop signal a few cycles after said edge of said time reference signal is received; and an AND gate for receiving said SCLK signal and said stop signal, said AND gate providing said SCLK signal as said clock signal when said stop signal is not generated.

9. The television system of claim 7, wherein said clock generation circuit further comprises an external oscillator for generating said internal reference signal, wherein said multiple is a small number such that said internal signal is synchronized closely with said internal reference signal.

10. The television system of claim 7, wherein each of said resettable oscillator and said first oscillator comprises a voltage controlled oscillator and said error signal comprises a voltage signal.

11. The television system of claim 7, wherein said clock generation circuit further comprises:

a charge pump coupled to said phase detector, said charge pump being charged by said error signal; and a low-pass filter coupled to said charge pump and said first oscillator, said low-pass filter passing low frequency components to said first oscillator.

12. The television system of claim 7, wherein said display controller is designed to operate while said SCLK signal is not generated.

13. A method of generating a clock signal synchronized with an edge of a time reference signal, said method comprising the steps of:

(a) generating a first periodic signal using a phase-lock-loop circuit, wherein said first periodic signal has a frequency equal to the frequency of said clock signal, wherein said phase-lock-loop circuit includes an oscillator driven by an error signal to generate said clock signal;

(b) generating said clock signal by driving a resettable oscillator with said error signal, wherein said resettable oscillator is designed to generate a signal having a frequency equal to that of said clock signal, said resettable oscillator having a restart input, wherein said signal is not generated by said resettable oscillator when said restart input is asserted;

(c) asserting said restart input a short duration prior to the expected arrival of said edge of said time reference signal;

(d) deasserting said restart input on the arrival of said edge of said time reference signal;

(e) providing said signal generated by said resettable oscillator as said clock signal, whereby said clock signal is synchronized with said edge of said time reference signal.

14. The method of claim 13, wherein step (e) comprises the steps of:

providing said signal generated by said resettable oscillator as said clock signal only after a few clock signals of said signal generated by said resettable oscillator such that glitches are avoided in said clock signal.

* * * * *